(12) United States Patent
Lee et al.

(10) Patent No.: US 9,885,105 B2
(45) Date of Patent: Feb. 6, 2018

(54) MASK STACK AND METHOD OF CONTROLLING THE SAME

(71) Applicant: Samsung Display Co., Ltd., Yongin, Gyeonggi-Do (KR)

(72) Inventors: Yongsuk Lee, Yongin (KR); Jongpyo Shin, Yongin (KR); Sunglae Cho, Yongin (KR); Jinok Choi, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 265 days.

(21) Appl. No.: 14/815,809

(22) Filed: Jul. 31, 2015

(65) Prior Publication Data

US 2016/0258050 A1 Sep. 8, 2016

(30) Foreign Application Priority Data

Mar. 3, 2015 (KR) .................. 10-2015-0029855

(51) Int. Cl.
*C23C 14/04* (2006.01)
*C23C 14/56* (2006.01)

(52) U.S. Cl.
CPC ............ *C23C 14/042* (2013.01); *C23C 14/56* (2013.01)

(58) Field of Classification Search
None
See application file for complete search history.

(56) References Cited

U.S. PATENT DOCUMENTS

| 2004/0150808 A1* | 8/2004 | Yamada ............. G03F 7/70741 355/72 |
| 2006/0012771 A1 | 1/2006 | Jeong |
| 2008/0017109 A1* | 1/2008 | Chiang ................ C23C 14/042 118/719 |
| 2014/0170785 A1* | 6/2014 | Kurita ..................... H01L 51/56 438/26 |
| 2016/0240403 A1* | 8/2016 | Cha ........................ H01L 51/001 |

FOREIGN PATENT DOCUMENTS

| JP | 10-63006 A | 3/1998 |
| JP | 2008-115441 A | 5/2008 |
| KR | 10-2006-0007211 A | 1/2006 |
| KR | 10-2013-0072602 A | 7/2013 |

* cited by examiner

*Primary Examiner* — Michael Wieczorek
*Assistant Examiner* — Bradford Gates
(74) *Attorney, Agent, or Firm* — Knobbe Martens Olson & Bear LLP

(57) ABSTRACT

A mask stack and a method of controlling the mask stack are disclosed. In one aspect, the method includes installing, in the mask stack, a first cassette comprising masks that have not been used in a deposition process and a second cassette comprising an accommodation space which is empty. The method also includes using, in the deposition process, at least one mask from the masks included in the first cassette. The method further includes inserting, into the accommodation space of the second cassette, the at least one mask used in the deposition process.

11 Claims, 13 Drawing Sheets

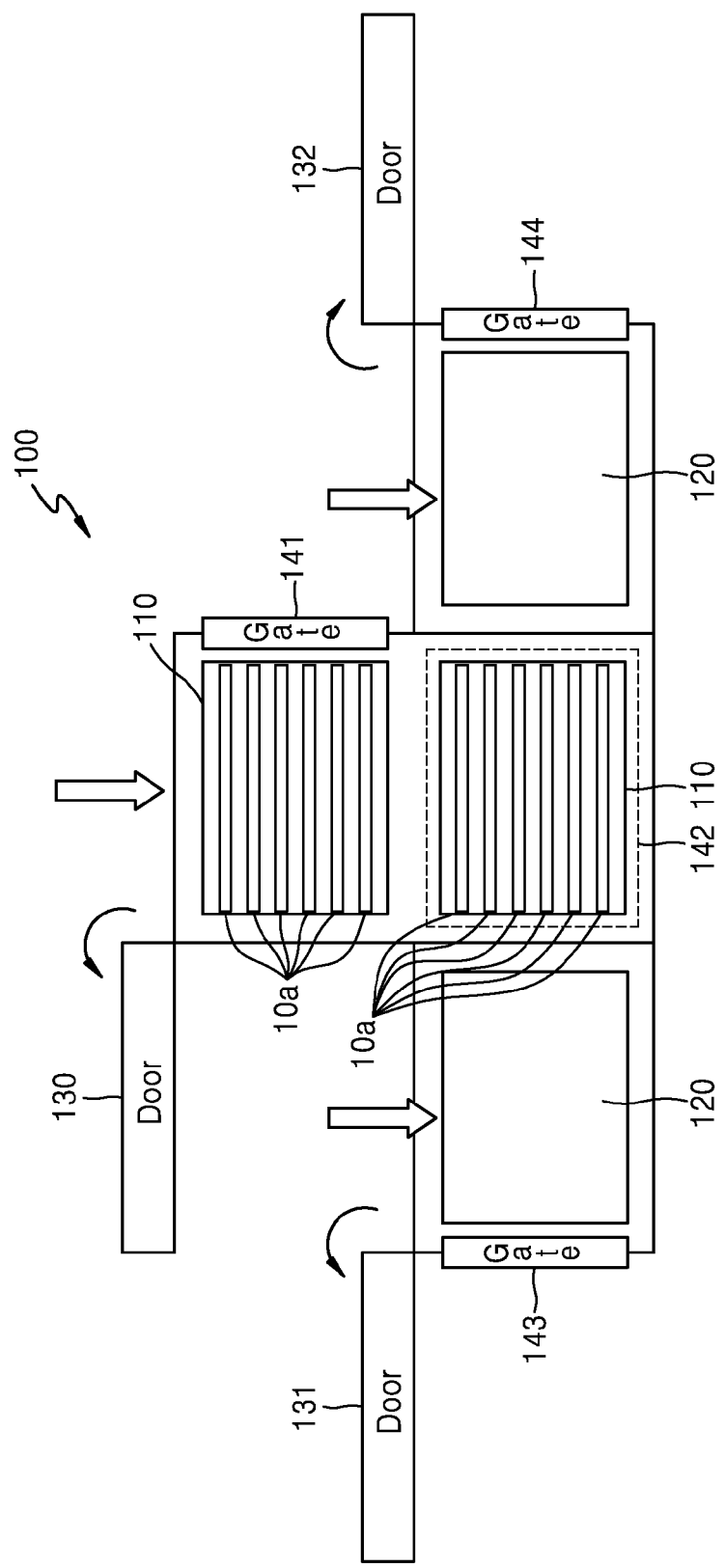

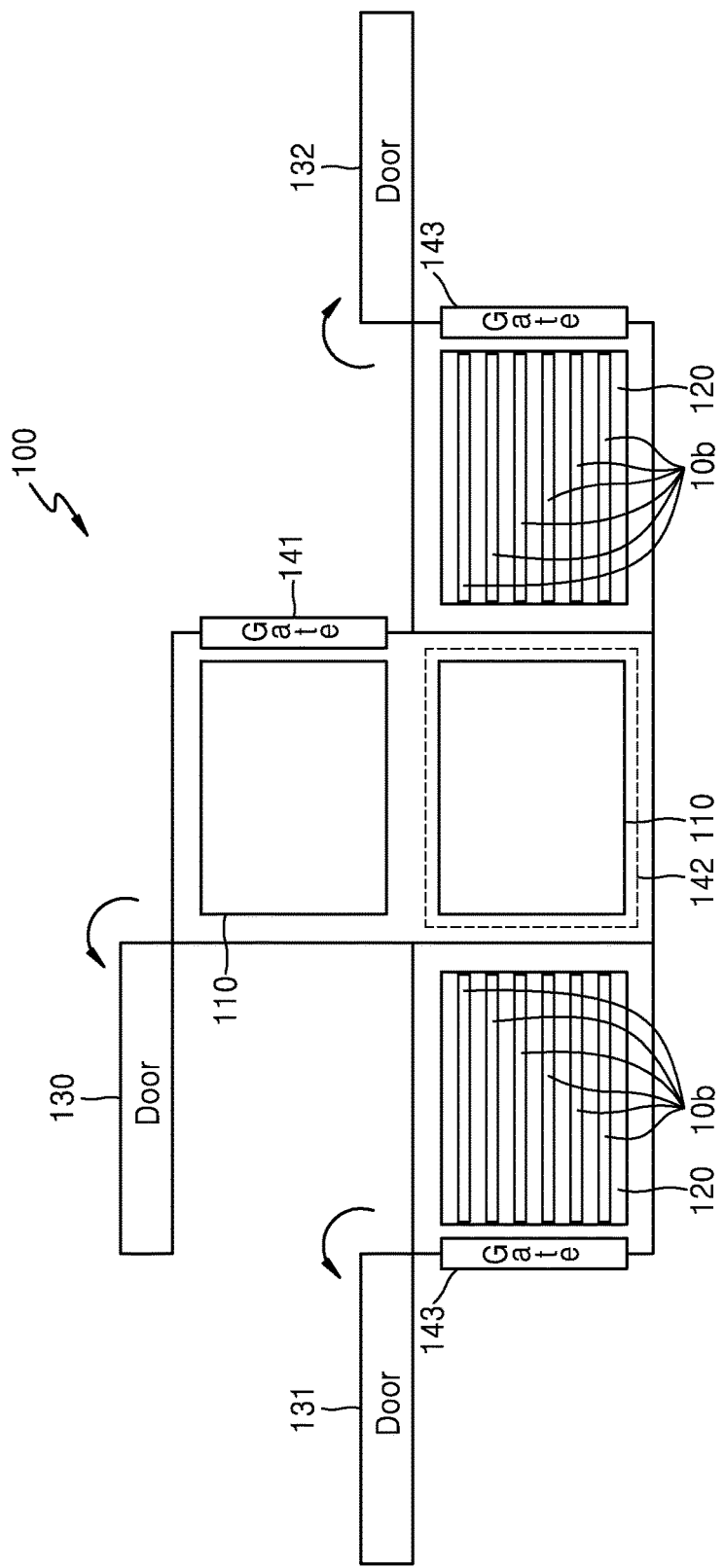

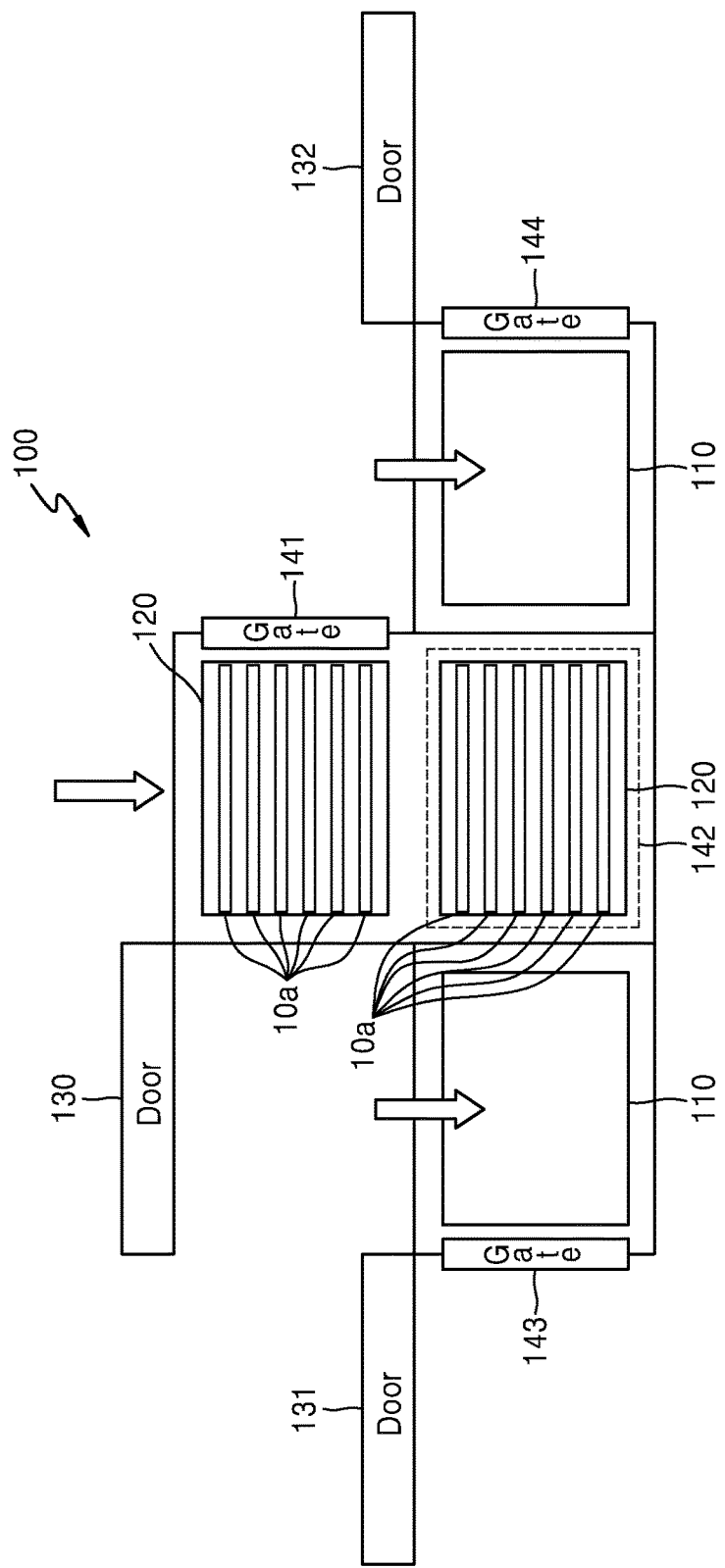

MASK STACK AND METHOD OF CONTROLLING THE SAME

RELATED APPLICATION

This application claims the benefit of Korean Patent Application No. 10-2015-0029855, filed on Mar. 3, 2015, in the Korean Intellectual Property Office, the disclosure of which is incorporated herein in its entirety by reference.

BACKGROUND

Field

The described technology generally relates to a mask stack and method of controlling the same.

Description of the Related Technology

In a thin film manufacturing process such as a process of forming a thin film of an organic light-emitting display device, a deposition process, in which a vapor is generated from a deposition source and the vapor adsorbs onto a surface of a substrate, is frequently used. That is, a mask is placed on the substrate and a vapor of the deposition source is passed through pattern holes formed in the mask so that a thin film having a desired pattern is formed on the substrate.

SUMMARY OF CERTAIN INVENTIVE ASPECTS

One inventive aspect relates to a mask stack in which masks are loaded and from which the masks are withdrawn, and a method of controlling the stack.

Another aspect is a mask stack, in which a mask that is frequently used in a thin film manufacturing process is loaded and from which the mask is withdrawn, and a method of controlling the stack.

Another aspect is a method of controlling a mask stack, that includes: installing, in the mask stack, a first cassette comprising masks that have not been used in a deposition process and a second cassette comprising an accommodation space which is empty; using, in the deposition process, at least one mask from among the masks comprised in the first cassette; and inserting, into the accommodation space of the second cassette, the at least one mask used in the deposition process.

The method may further include, once all the masks comprised in the first cassette are transported to and inserted into the second cassette, removing the first cassette and the second cassette from the mask stack.

The method may further include reinstalling, in the mask stack, the first cassette and the second cassette, wherein, when reinstalled, the first cassette comprises an accommodation space which is empty and the second cassette comprises masks that have not been used in a deposition process.

The method may further include, after removing the first cassette and the second cassette from the mask stack, installing, in the mask stack, a third cassette comprising masks that have not been used in a deposition process and a fourth cassette having an accommodation space which is empty.

The first cassette and the second cassette may be vertically placed in the mask stack.

The first cassette and the second cassette may be horizontally placed in the mask stack.

A plurality of first cassettes and a plurality of second cassettes may be installed in the mask stack.

Another aspect is a mask stack that includes: a first cassette; and a second cassette, wherein masks in the first cassette have not been used in a deposition process, and masks that have been used in the deposition process are inserted into the second cassette.

The first cassette and the second cassette may be vertically placed.

The first cassette and the second cassette may be horizontally placed.

A plurality of first cassettes and a plurality of second cassettes may be installed in the mask stack.

BRIEF DESCRIPTION OF THE DRAWINGS

These and/or other aspects will become apparent and more readily appreciated from the following description of the exemplary embodiments, taken in conjunction with the accompanying drawings.

FIGS. 5A through 5E illustrate a structure of the mask stack illustrated in FIG. 1 and a method of controlling the mask stack in a sequence, according to another exemplary embodiment.

DETAILED DESCRIPTION OF CERTAIN INVENTIVE EMBODIMENTS

Figure 1:
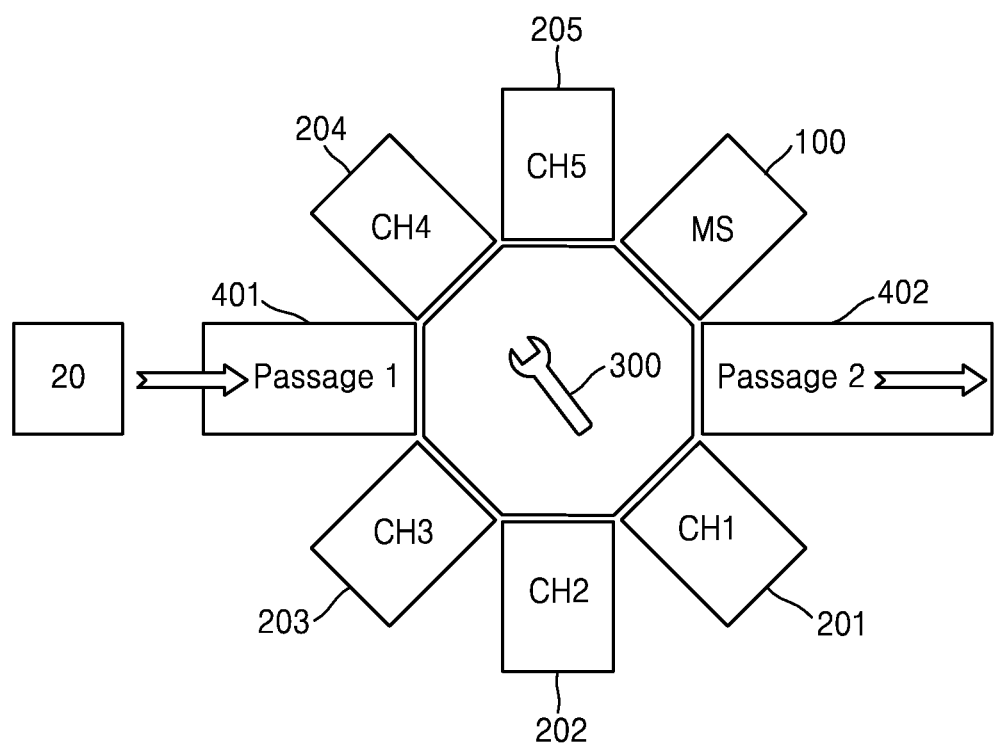
FIG. 1 is a schematic structural diagram of a thin film deposition apparatus in which a mask stack is included, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Since the inventive concept may have various modifications and several embodiments, exemplary embodiments are shown in the drawings and will be described in detail. Advantages, features, and a method of achieving the same will be specified with reference to the embodiments described below in detail together with the attached drawings. However, the embodiments may have different forms and should not be construed as being limited to the descriptions set forth herein.

The embodiments of the inventive concept will be described below in more detail with reference to the accompanying drawings. Those components that are the same or are in correspondence are rendered the same reference numeral regardless of the figure number, and redundant explanations are omitted.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

In the embodiments below, it will be understood when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an embodiment is implementable in another manner, a predetermined process order may be different from a described one. For example, two processes that are consecutively described may be substantially simultaneously performed or may be performed in an opposite order to the described order. In this disclosure, the term "substantially" includes the meanings of completely, almost completely or to any significant degree under some applications and in accordance with those skilled in the art. The term "connected" includes an electrical connection.

FIG. 1 is a schematic structural diagram of a thin film deposition apparatus in which a mask stack 100 is included, according to an exemplary embodiment.

As illustrated in FIG. 1, the thin film deposition apparatus has a structure, in which a robot arm 300 is placed in a center portion between an entrance passage (or passage 1) 401 and an exit passage (or passage 2) 402 of a substrate 20, which is an object to be deposited, and a plurality of deposition chambers (or CH1-CH5) 201, 202, 203, 204, and 205 and the mask stack 100 surround the robot arm 300 in a cluster shape.

Accordingly, the robot arm 300 inputs the substrate 20 and a mask 10 (see FIG. 2) of the mask stack 100 that have entered the entrance passage 401 to one of the deposition chambers 201-205 to perform deposition on the substrate 20, and the substrate 20, on which deposition is completed, is transported to a next process through the exit passage 402.

Figure 2:
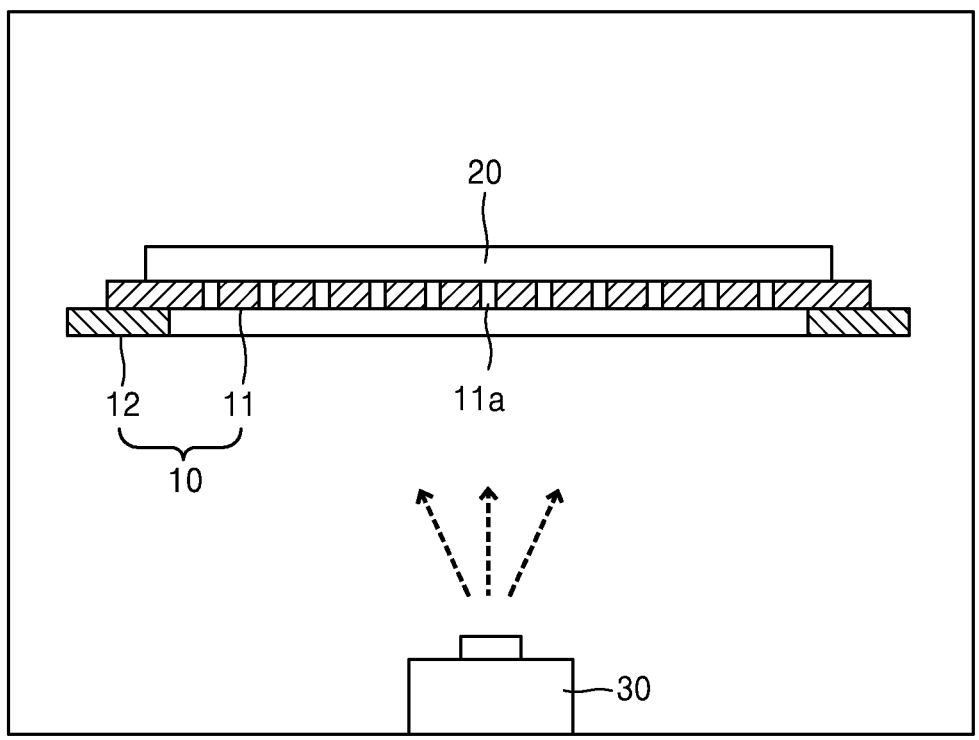
FIG. 2 illustrates an inner portion of a deposition chamber illustrated in FIG. 1.

FIG. 2 illustrates an inner portion of the deposition chamber 201 from among the deposition chambers 201-205. When a deposition gas or deposition material is ejected from a deposition source 30, the deposition gas passes through a plurality of pattern holes 11a formed in the mask 10 to be deposited on the substrate 20, thereby forming a thin film having a predetermined pattern.

Figure 3:
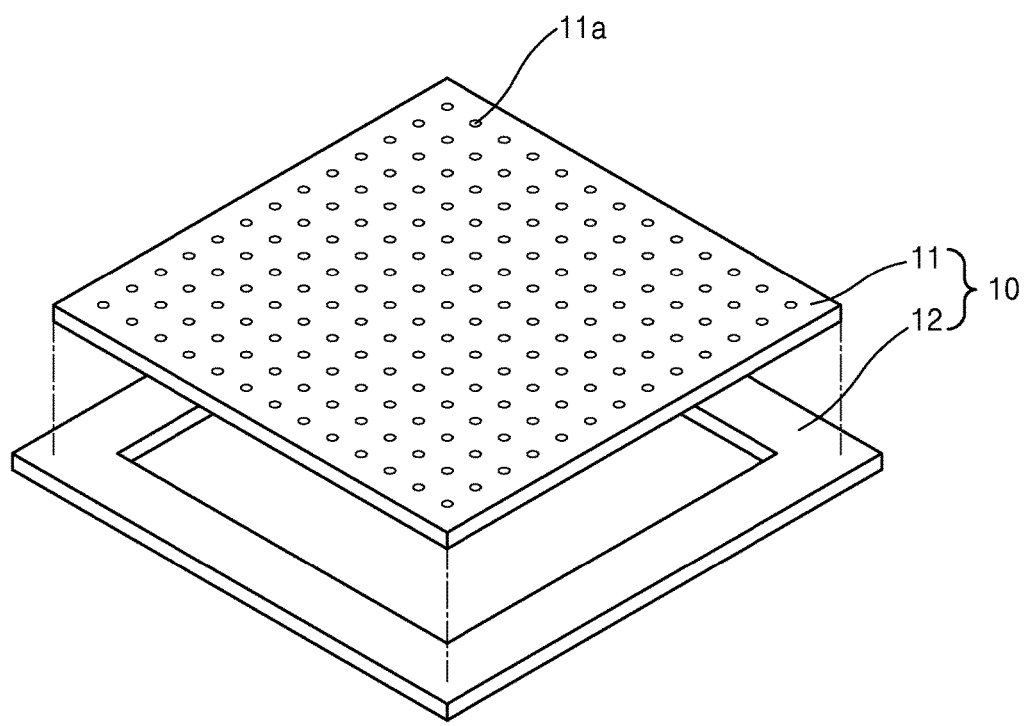
FIG. 3 illustrates a mask used in deposition performed in a deposition chamber of FIG. 2.

FIG. 3 illustrates a mask 10 used in deposition performed in a deposition chamber of FIG. 2. The mask 10 includes a mask plate 11, in which the pattern holes 11a are formed, and a frame 12 that is coupled to edges of the mask plate 11. In general, the mask 10 is also referred to as a mask frame assembly, but here it will be referred to as the mask 10.

The mask stack 100 is a device which the mask 10 is loaded into and is used for transporting the mask 10 to and from various deposition chambers during a deposition process. The mask stack 100 according to the present exemplary embodiment is configured and controlled as illustrated in FIGS. 4A through 4E.

Figure 4A:
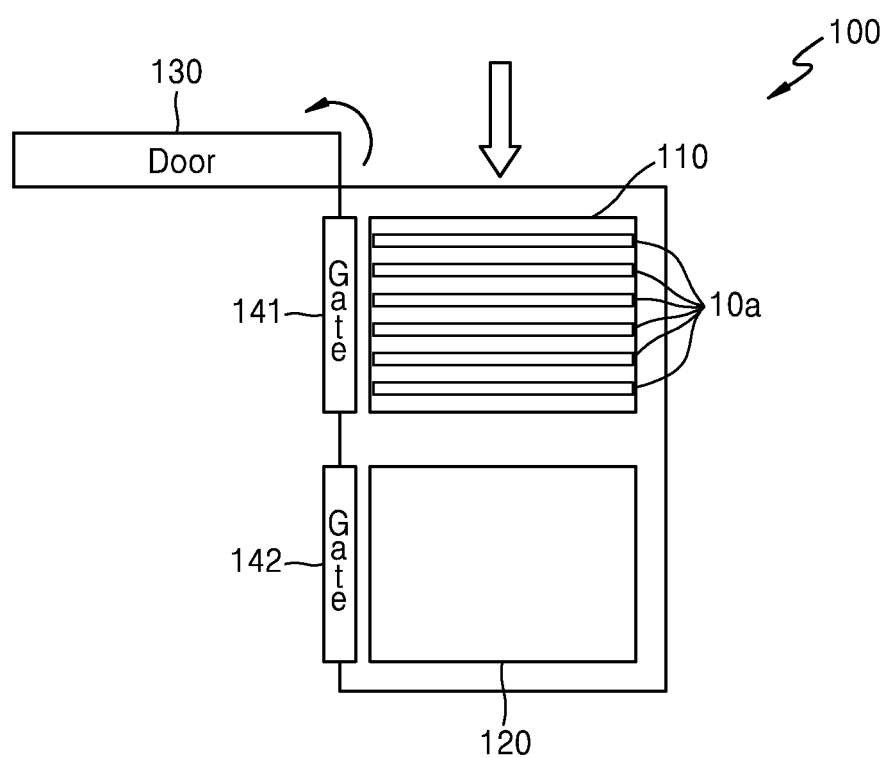
FIGS. 4A through 4E illustrate a structure of the mask stack illustrated in FIG. 1 and a method of controlling the mask stack in a sequence, according to an exemplary embodiment.

First, as illustrated in FIG. 4A, a first cassette 110 and a second cassette 120 are substantially vertically installed in the mask stack 100. The first cassette 110 accommodates new masks 10a which have not been used in a deposition process yet, whereas the second cassette 120 has an empty accommodation space. When installing the first cassette 110 and the second cassette 120, a door 130 located at an upper end of the mask stack 100 is opened and the second cassette 120 is first loaded from above to below, and then the first cassette 110 is loaded thereafter, as illustrated in FIG. 4A. Then, gates 141 and 142 that respectively correspond to the first cassette 110 and the second cassette 120 and are used to take and input the masks 10a and 10b (see FIG. 4B) before and after use from and to the mask stack 100 are included in the mask stack 100. While opened or closed states of the gates 141 and 142 are not exactly illustrated for convenience of description, the gates 141 and 142 are opened when taking out or inputting the masks 10a and 10b from or into the mask stack 100, and otherwise closed.

Figure 4B:
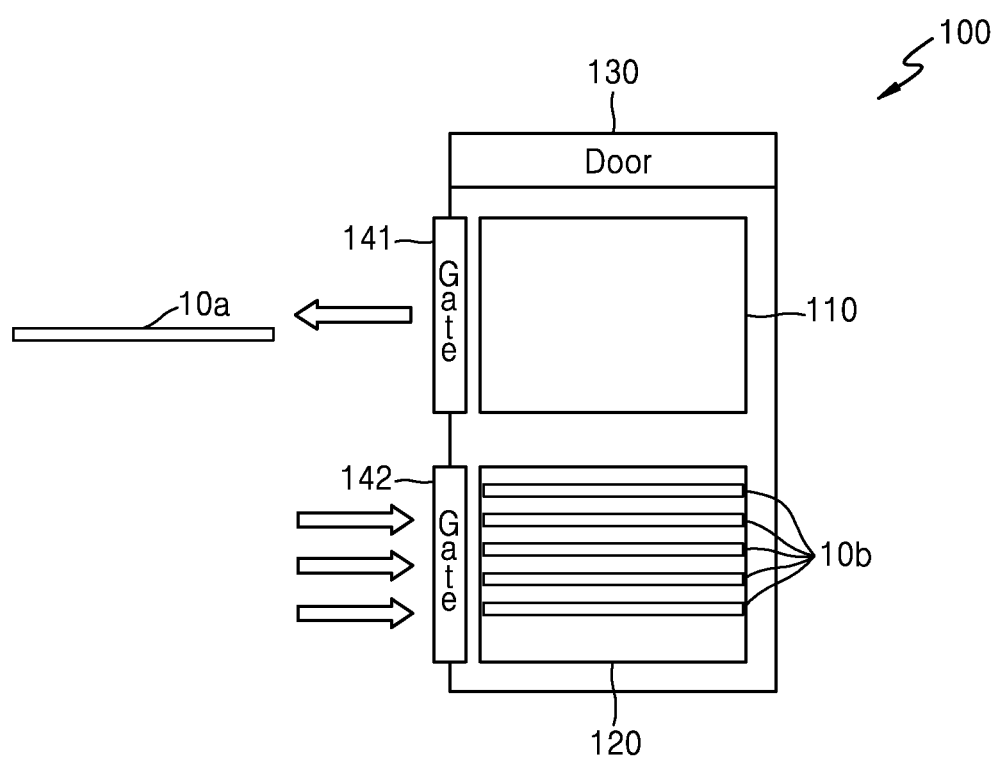

After completing installation of the first and second cassettes 110 and 120 as described above, the robot arm 300 (see FIG. 1) takes, one by one, the masks 10a that are accommodated in the first cassette 110 and have not been used and inputs the same into a selected deposition chamber from among the deposition chambers 201-205, as illustrated in FIG. 4B. Then the masks 10b, which have already been used in the deposition process, are returned to the second cassette 120 and accommodated therein.

That is, the masks 10a that have not been used are loaded only in the first cassette 110, and the masks 10b that have already been used are loaded only in the second cassette 120 so that the masks 10a and 10b before and after use are separated from each other.

Accordingly, the masks 10b, which are polluted after the deposition process, does not contact the masks 10a, which are new and before use, at all, and thus, pollution of the new masks 10a due to the masks 10b, which are used, may be prevented from the start.

Figure 4C:
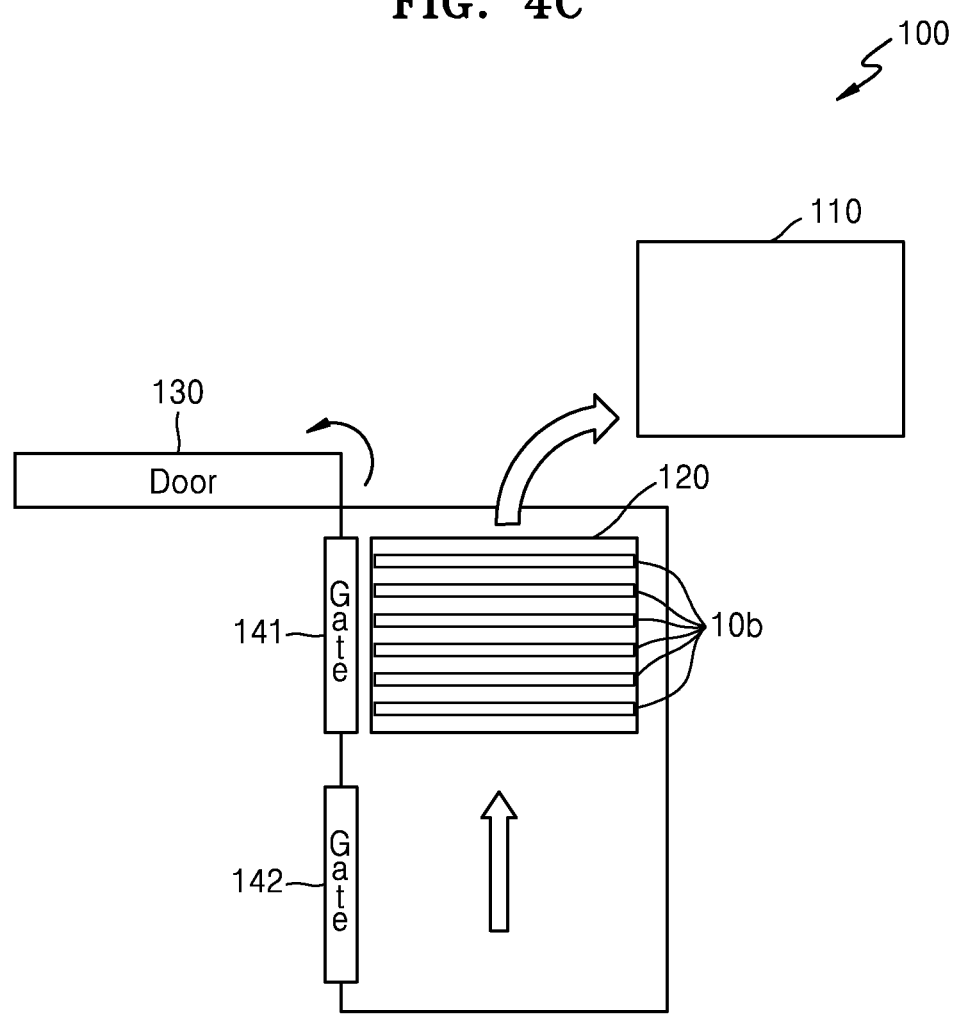

Next, when all of the masks 10a in the first cassette 110 are used and moved to and accommodated in the second cassette 120, the first cassette 110 which is empty and the second cassette 120, in which the masks 10b that are used are accommodated, are taken out from the mask stack 100 as illustrated in FIG. 4C.

Figure 4D:
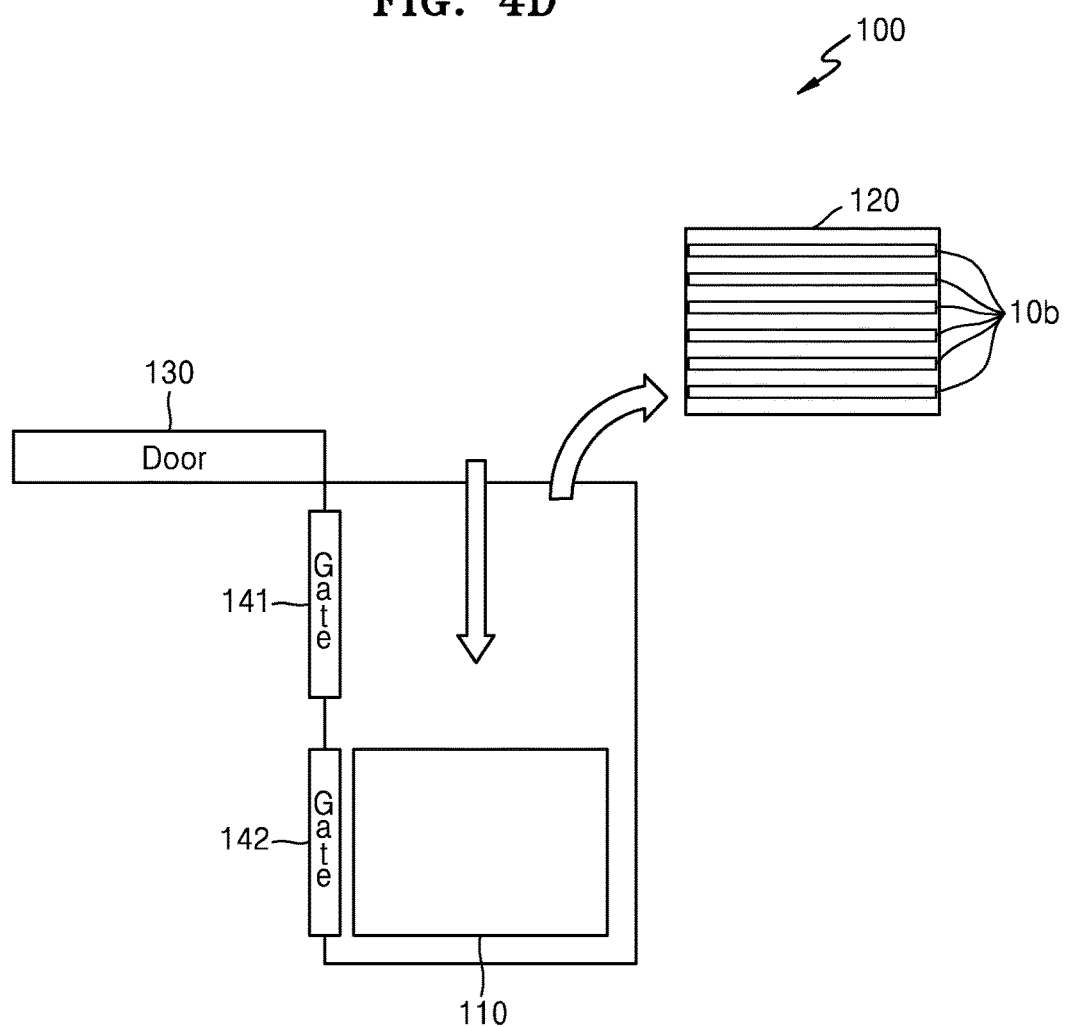

Then, the first cassette 110 which is empty is installed under the mask stack 100 as an empty cassette again as illustrated in FIG. 4D. In other words, the first cassette 110 now performs the function previously performed by the second cassette 120.

Figure 4E:
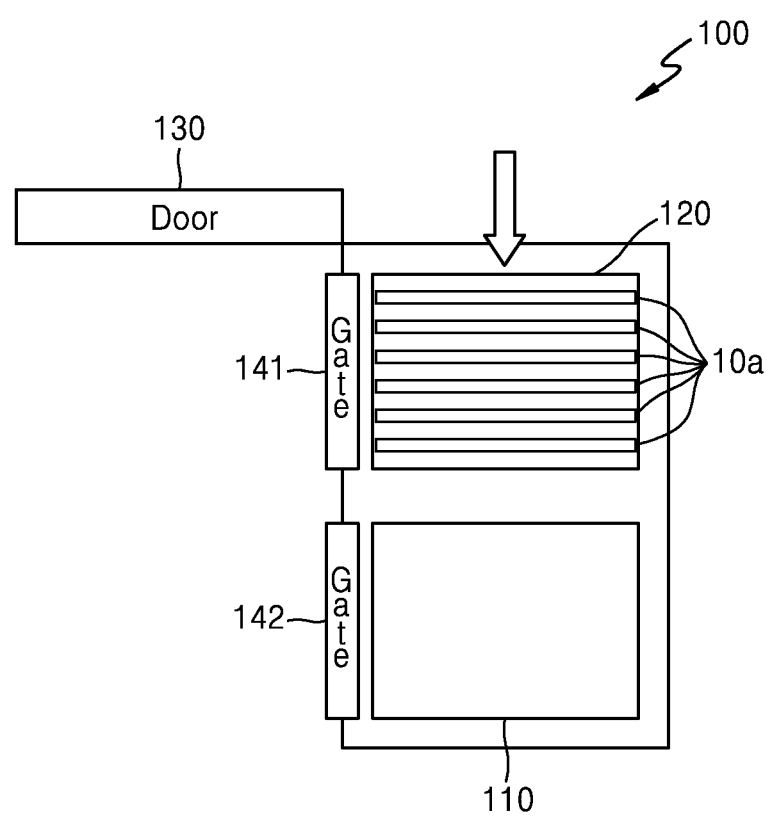

Then, after replacing the masks 10b that are used, with new masks 10a in the second cassette 120, the second cassette 120 is installed again on the first cassette 110 of the mask stack 100 as illustrated in FIG. 4E. In other words, the second cassette 120 now performs the function previously performed by the first cassette 110.

By alternately using the first cassette 110 and the second cassette 120 in the above-described manner, the masks 10a which have not been used and the masks 10b that have already been used are separately accommodated so that masks may be easily replaced while minimizing the risk of pollution between the masks 10a and 10b before and after use.

While a method of continuously circulating only the first and second cassettes 110 and 120 is described above, in order to reduce time for exchange, a third cassette, in which masks 10a which have not been used in a deposition process are accommodated (corresponds to the second cassette 120 of FIG. 4E), and a fourth cassette having an empty accommodation space (corresponds to the first cassette 110 of FIG. 4E) may be prepared and immediately loaded after taking out the first cassette 110 and the second cassette 120.

Next, FIGS. 5A through 5E illustrates a mask stack 100 and a method of controlling the mask stack 100 according to another exemplary embodiment.

While the first and second cassettes 110 and 120 are substantially vertically placed in the mask stack 100 in the previous exemplary embodiment, a plurality of first cassettes 110 and a plurality of second cassettes 120 are substantially horizontally placed in the present exemplary embodiment.

That is, as illustrated in FIG. 5A, two first cassettes 110 are stacked in a center portion of the mask stack 100, and a second cassette 120 is installed at each of two sides of the first cassettes 110.

New masks 10a that have not been used are accommodated in the first cassettes 110, and accommodation space of the second cassettes 120 is empty. Doors 130, 131, and 132 are included, which are respectively used to take out and input the first and second cassettes 110 and 120, and gates 141, 142, 143, and 144 that are used by the robot arm 300 to take out and input the masks 10a and 10b before and after use are also included.

Figure 5B:
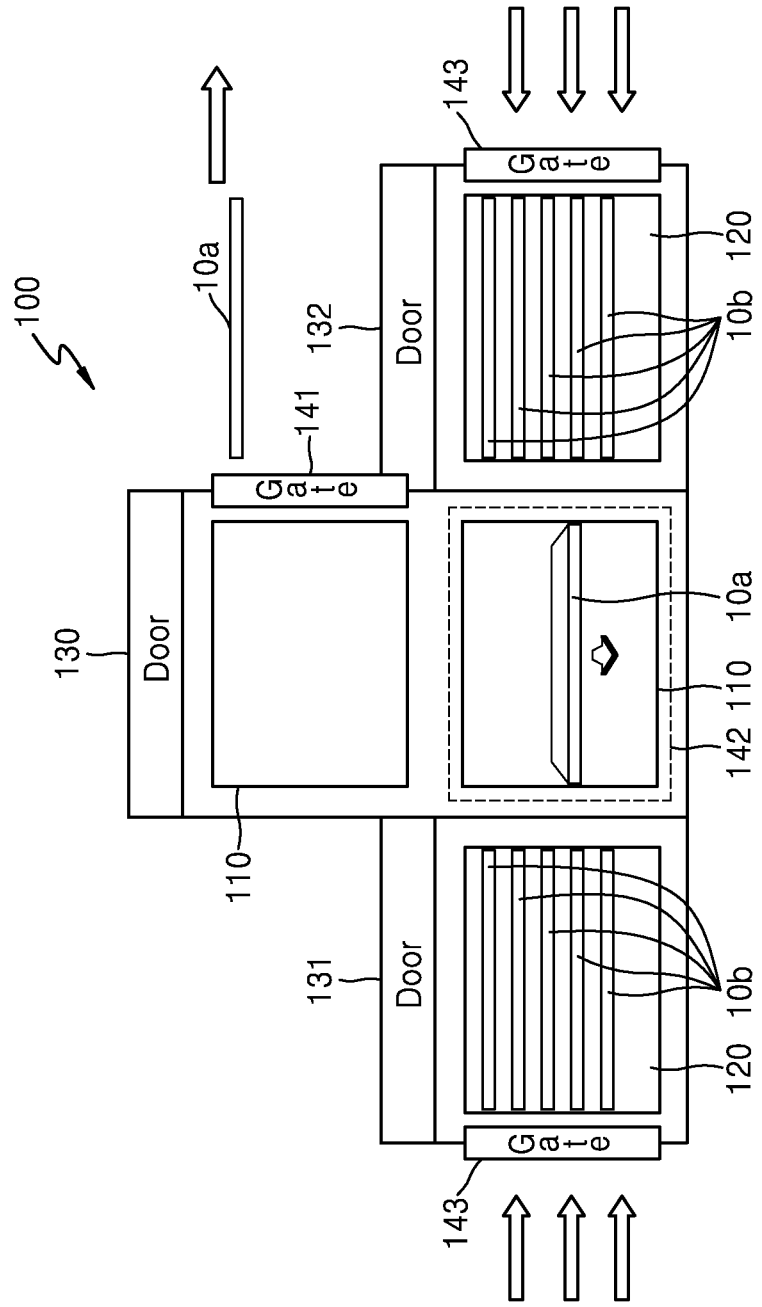

When installation of the first cassettes 110 and the second cassettes 120 is completed as described above, the robot arm 300 (see FIG. 1) takes the masks 10a which are accommodated in the first cassettes 110 and are before use one by one as illustrated in FIG. 5B and inputs the same to a selected deposition chamber from among the deposition chambers 201-205. Then, the masks 10b, for which deposition is completed, are returned to the second cassettes 120 to be accommodated therein.

Likewise, the masks 10a that are before use are loaded only in the first cassettes 110, and the masks 10b that are used are loaded only in the second cassette 120 so that the masks 10a and 10b before and after use are separated from each other.

Accordingly, the masks 10b, which are polluted after the deposition process, do not contact the new masks 10a, which are before use, at all, and thus, pollution of the new masks 10a due to the masks 10b, which are used, may be prevented from the start.

Figure 5D:
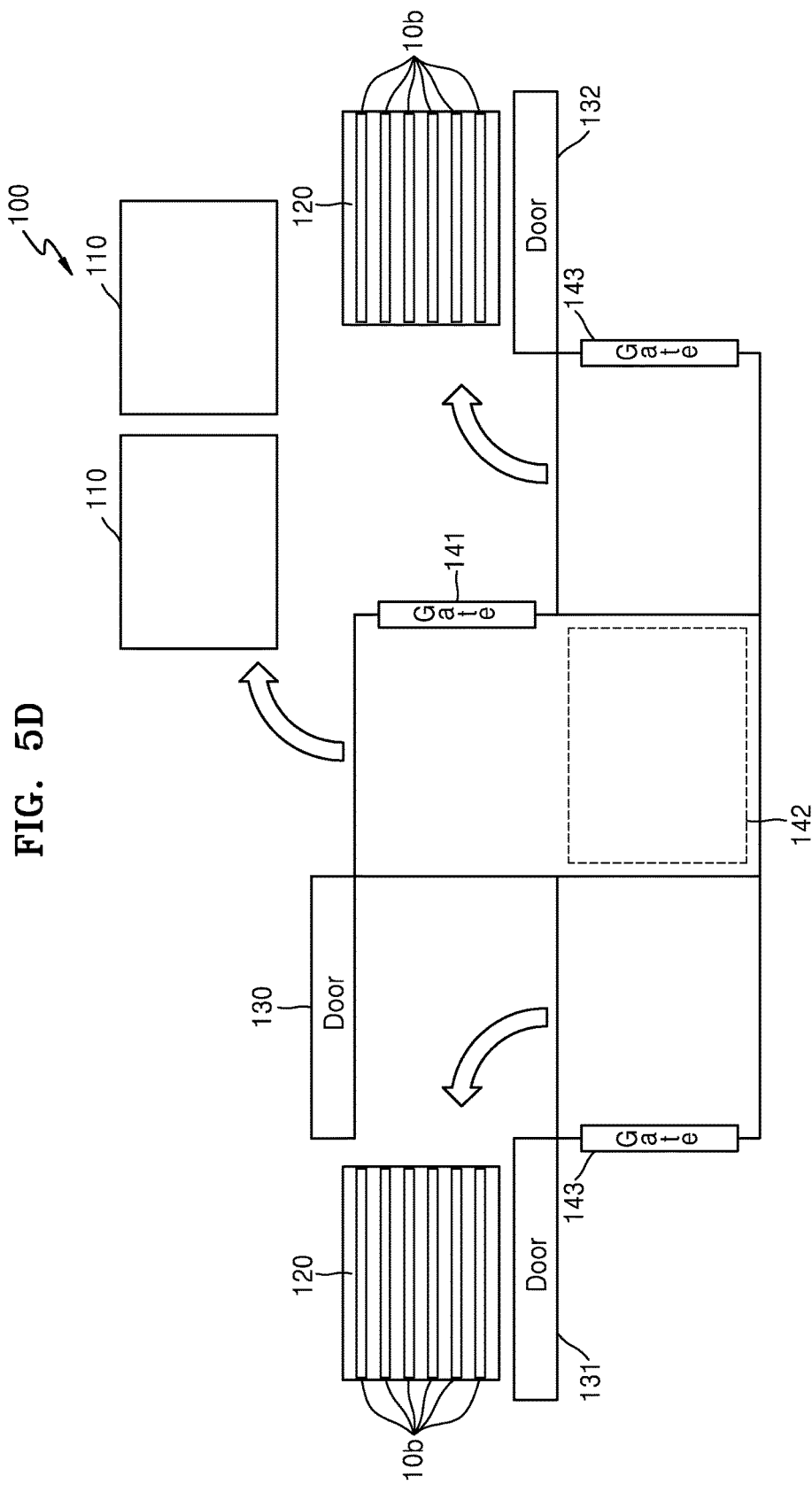

Next, when all of the masks 10a in the first cassettes 110 are used and moved to and accommodated in the second cassettes 120, all of the doors 130, 131, and 132 are opened as illustrated in FIG. 5C to take out the first cassettes 110, which are empty, and the second cassettes 120, in which the masks 10b that are used are accommodated, from the mask stack 100 as illustrated in FIG. 5D.

Then, the first cassettes 110, which are empty, are installed under the mask stack 100 as empty cassettes again, and the masks 10b, which are used, are replaced with new masks 10a in the second cassettes 120 and are installed again in a center portion of the mask stack 100 as illustrated in FIG. 5E. In other words, the functions previously performed by the first and second cassettes 110 and 120 are now exchanged.

By alternately using the two types of cassettes, the first cassettes 110 and the second cassettes 120, in the above-described manner, the masks 10a that are before use and the masks 10b that are used are separately accommodated so as to implement a process of easily replacing masks without pollution between the masks 10a and 10b before and after use.

While a method of continuously circulating only the first cassettes 110 and the second cassettes 120 is described above, in order to reduce time for exchange, a third cassette, in which masks 10a that have not been used in a deposition process are accommodated (corresponds to the second cassettes 120 of FIG. 5E), and a fourth cassette having an empty accommodation space (corresponds to the first cassettes 110 of FIG. 5E) may be prepared and immediately loaded after taking out the first cassettes 110 and the second cassettes 120.

That is, only the first and second cassettes 110 and 120 which are in use in the mask stack 100 may be continuously circulated for use, or, the third and fourth cassettes may be prepared as preliminary cassettes and alternately used with the first and second cassettes 110 and 120.

As described above, according to at least one of the disclosed embodiments, masks that have not been used in a deposition process and masks that are used in the deposition process are separately managed, and thus pollution of the masks that are not used yet, due to the masks that are used may be prevented from the start, and a quality of thin films formed through mask deposition may also be secured accordingly.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A method of controlling a mask stack, the method comprising:
    installing, in the mask stack, a first cassette comprising masks that have not been used in a deposition process and a second cassette comprising an accommodation space which is empty;
    using, in the deposition process, at least one mask from the masks included in the first cassette;
    inserting, into the accommodation space of the second cassette, the at least one mask used in the deposition process;
    once all the masks included in the first cassette are transported to and inserted into the second cassette, removing the first and second cassettes from the mask stack; and
    reinstalling, in the mask stack, the first and second cassettes, wherein, when reinstalled, the first cassette comprises an accommodation space which is empty and the second cassette comprises masks that have not been used in a deposition process.

2. The method of claim 1, wherein the first and second cassettes are substantially vertically stacked to each other, when placed in the mask stack.

3. The method of claim 1, wherein the first and second cassettes are substantially horizontally stacked to each other, when placed in the mask stack.

4. The method of claim 1, wherein each of the first and second cassettes comprises a plurality of cassettes.

5. The method of claim 4, further comprising:
    placing the first cassettes substantially vertically stacked to each other in the mask stack; and
    placing the second cassettes substantially horizontally stacked to each other in the mask stack.

6. The method of claim 5, further comprising placing the first cassettes between the second cassettes.

7. A method of controlling a mask stack, the method comprising:
    loading masks that have not been used in a deposition process only into a first cassette of the mask stack;

using, in the deposition process, at least one mask from the masks included in the first cassette;

loading masks that have already been used in the deposition process only into a second cassette of the mask stack separated from the first cassette;

once all the masks included in the first cassette are transported to and inserted into the second cassette, removing the first and second cassettes from the mask stack; and reinstalling, in the mask stack, the first and second cassettes, wherein, when reinstalled, the first cassette comprises an accommodation space which is empty and the second cassette comprises masks that have not been used in a deposition process.

8. The method of claim 7, wherein each of the first and second cassettes comprises a plurality of cassettes.

9. The method of claim 8, further comprising:

placing the first cassettes substantially vertically stacked with respect to each other in the mask stack; and placing the second cassettes substantially horizontally stacked with respect to each other in the mask stack.

10. The method of claim 9, further comprising placing the first cassettes between the second cassettes.

11. The method of claim 10, wherein the same number of second cassettes are placed on opposite sides of the first cassettes.

* * * * *